United States Patent
Huang et al.

(10) Patent No.: US 12,519,432 B2
(45) Date of Patent: Jan. 6, 2026

(54) POWER CONVERTER AND ASSOCIATED CONTROL METHOD FOR HIGH-EFFICIENCY AUDIO AMPLIFIER

(71) Applicant: MEDIATEK INC., Hsin-Chu (TW)

(72) Inventors: Yi-Wei Huang, Hsinchu (TW); Sung-Han Wen, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 486 days.

(21) Appl. No.: 18/085,579

(22) Filed: Dec. 21, 2022

(65) Prior Publication Data

US 2023/0231523 A1 Jul. 20, 2023

Related U.S. Application Data

(60) Provisional application No. 63/299,422, filed on Jan. 14, 2022.

(51) Int. Cl.
*H03F 1/30* (2006.01)
*H03F 3/217* (2006.01)

(52) U.S. Cl.
CPC .................. *H03F 3/217* (2013.01)

(58) Field of Classification Search
CPC ......................................... H03F 1/30
USPC ....................... 330/297, 296, 285
See application file for complete search history.

(56) References Cited

U.S. PATENT DOCUMENTS

| | | | |
|---|---|---|---|
| 7,276,886 B2 | 10/2007 | Kinder et al. | |
| 8,310,313 B2* | 11/2012 | Guo | H03F 1/0244 330/296 |
| 9,189,002 B1 | 11/2015 | Luciano | |
| 9,837,901 B1 | 12/2017 | Volk | |
| 10,110,120 B2* | 10/2018 | Høyerby | H02M 3/07 |
| 11,616,442 B2* | 3/2023 | Lu | H02M 1/009 323/282 |
| 2007/0139121 A1* | 6/2007 | Baldwin | H03F 3/20 330/297 |
| 2011/0084760 A1 | 4/2011 | Guo | |
| 2017/0324321 A1 | 11/2017 | Høyerby | |
| 2021/0408908 A1 | 12/2021 | Lu | |

FOREIGN PATENT DOCUMENTS

| | | |
|---|---|---|
| CN | 102751868 A | 10/2012 |
| CN | 102751868 B | 5/2015 |
| TW | 202005344 A | 1/2020 |

(Continued)

OTHER PUBLICATIONS

"Single-Inductor, Multiple-Output Regulator", Texas Instruments ,2011.

(Continued)

*Primary Examiner* — Henry Choe
(74) *Attorney, Agent, or Firm* — Winston Hsu

(57) ABSTRACT

The present invention provides an amplifier system including an audio amplifier and a power converter. The audio amplifier is supplied by at least a first supply voltage and a second supply voltage, and the audio amplifier is configured to receive an audio signal to generate an output signal. The power converter includes only one inductor, and is configured to generate the first supply voltage and the second supply voltage according to an input voltage.

15 Claims, 7 Drawing Sheets

(56) References Cited

FOREIGN PATENT DOCUMENTS

WO  2013/055171 A1  4/2013
WO  2017/222568 A1  12/2017

OTHER PUBLICATIONS

Shon-Hang Wen, "A Load-Adaptive Class-G Headphone Amplifier With Supply-Rejection Bandwidth Enhancement Technique", IEEE Journal of Solid-State Circuits, vol. 51, No. 10, Oct. 2016.
Xavier Branca et al., Single-Inductor Bipolar-Outputs Converter for the Supply of Audio Amplifiers in Mobile Platforms, IEEE Transactions On Power Electronics, Sep. 2013, pp. 4248-4259, vol. 28, No. 9, IEEE, XP011494221.

\* cited by examiner

POWER CONVERTER AND ASSOCIATED CONTROL METHOD FOR HIGH-EFFICIENCY AUDIO AMPLIFIER

CROSS REFERENCE TO RELATED APPLICATIONS

This application claims the benefit of U.S. Provisional Application No. 63/299,422, filed on Jan. 14, 2022. The content of the application is incorporated herein by reference.

BACKGROUND

In a conventional audio amplifier, two or more supply voltages are required for the audio amplifier to process a digital input audio signal to generate an analog output audio signal. In order to generate the two or more supply voltages, a power converter is generally designed to have two or more inductors, which increases the form factor and manufacturing costs.

SUMMARY

It is therefore an objective of the present invention to provide an audio amplifier and related power converter, wherein the power converter can use only one inductor to generate two or three supply voltages for use of the audio amplifier, and the power converter has higher efficiency, to solve the above-mentioned problems.

According to one embodiment of the present invention, an amplifier system comprising an audio amplifier and a power converter is disclosed. The audio amplifier is supplied by at least a first supply voltage and a second supply voltage, and the audio amplifier is configured to receive an audio signal to generate an output signal. The power converter comprises only one inductor, and is configured to generate the first supply voltage and the second supply voltage according to an input voltage.

According to one embodiment of the present invention, a power converter is disclosed. The power converter is configured to receive an input voltage to generate a first supply voltage and a second supply voltage, and the power converter comprises an inductor, a first switch, a second switch, a third switch, a fourth switch and a fifth switch. The inductor has a first terminal and a second terminal; the first switch is configured to selectively connect the input voltage to the first terminal of the inductor; the second switch is configured to selectively connect the second terminal of the inductor to a ground voltage; the third switch is configured to selectively connect the second terminal of the inductor to the first supply voltage; the fourth switch is configured to selectively connect the first terminal of the inductor to the second supply voltage; and the fifth switch is configured to selectively connect the first terminal of the inductor to the ground voltage.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
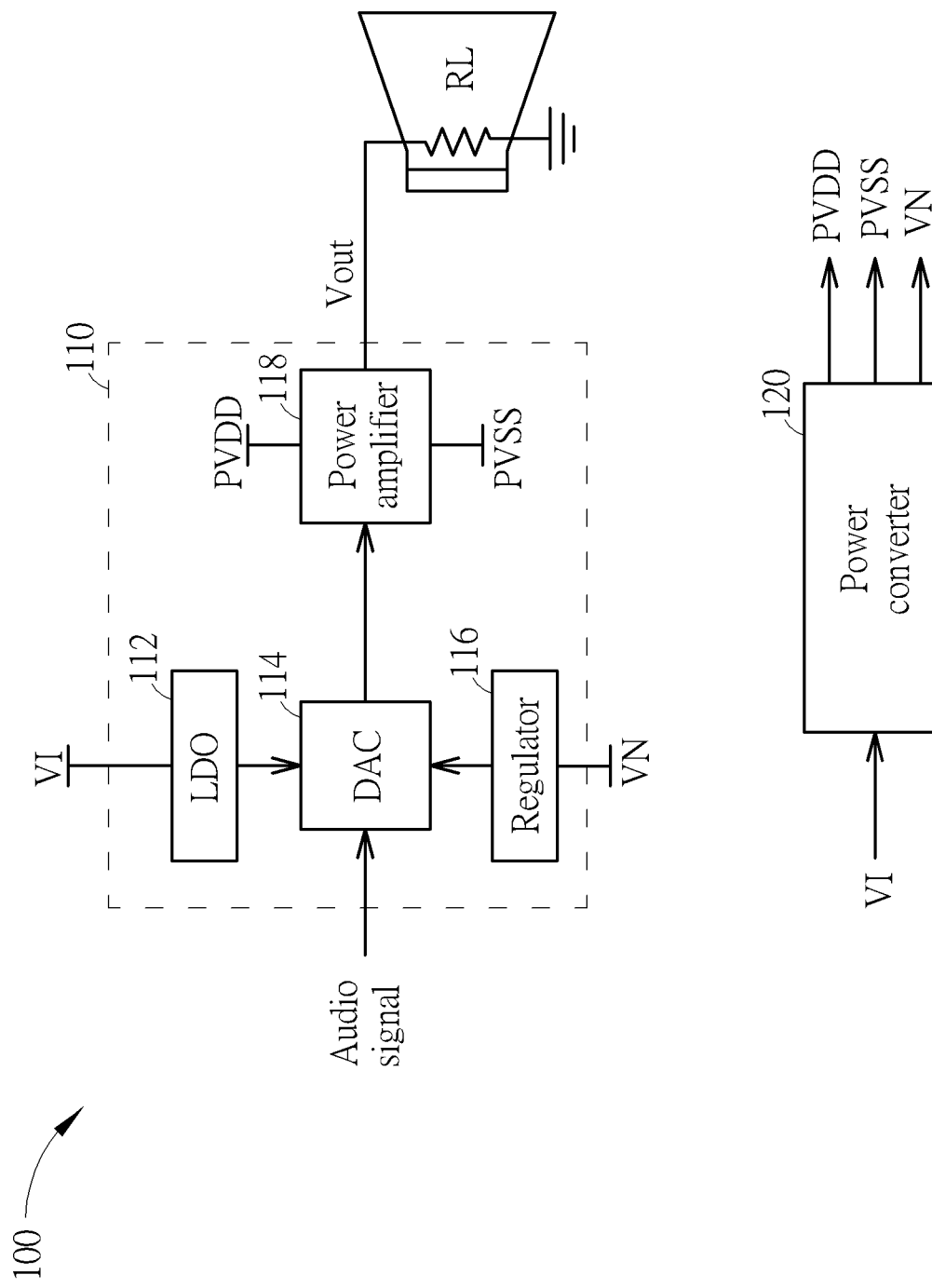
FIG. 1 is a diagram illustrating an amplifier system according to one embodiment of the present invention.

FIG. 1 is a diagram illustrating an amplifier system 100 according to one embodiment of the present invention. As shown in FIG. 1, the amplifier system 100 comprises audio amplifier 110 and a power converter 120, wherein the audio amplifier 110 comprises a low dropout regulator (LDO) 112, a digital-to-analog converter (DAC) 114, a regulator 116 and a power amplifier 118. The LDO 112 and the regulator 116 are configured to provide supply voltages to the DAC 114, for the DAC 114 to perform the digital-to-analog conversion operation upon an audio signal to generate an analog signal, and the power amplifier 118 amplifies the analog signal to generate an output signal Vout to drive a speaker (a resistor RL serves as a load or an equivalent resistance of the speaker). In this embodiment, the amplifier system 100 is supplied by four different supply voltages, wherein an input voltage VI is provided to the LDO 112, a negative supply voltage VN is provided to the regulator 116, and supply voltages PVDD and PVSS are used by the power amplifier 118. In addition, the power converter 120 is configured to receive the input voltage VI to generate the other supply voltages PVDD, PVSS and VN.

Figure 2:
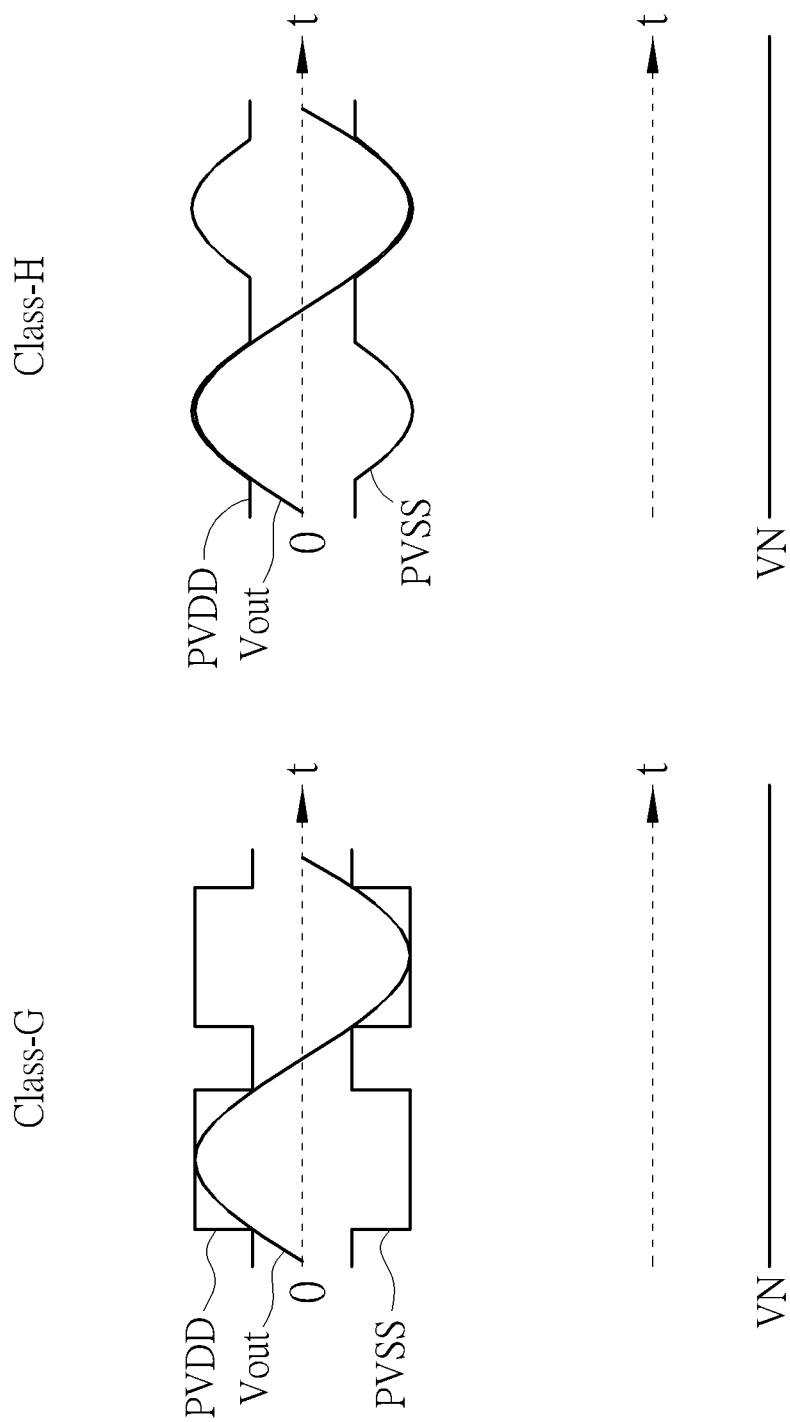
FIG. 2 shows supply voltages of the audio amplifier for class-G and class-H amplifier.

In one embodiment, the negative supply voltage VN has a fixed voltage level, and the supply voltages PVDD and PVSS are signal-dependent supply voltages. For example, referring to FIG. 2, the power amplifier 118 may be a class-G amplifier or a class-H amplifier that provides several power rails at different voltages, and the supply voltage PVDD/PVSS is controlled to at least have one of the power rails based on the information of the audio signal, to make the supply voltage PVDD/PVSS be only a few hundred-millivolts larger than the output signal Vout.

Figure 3:
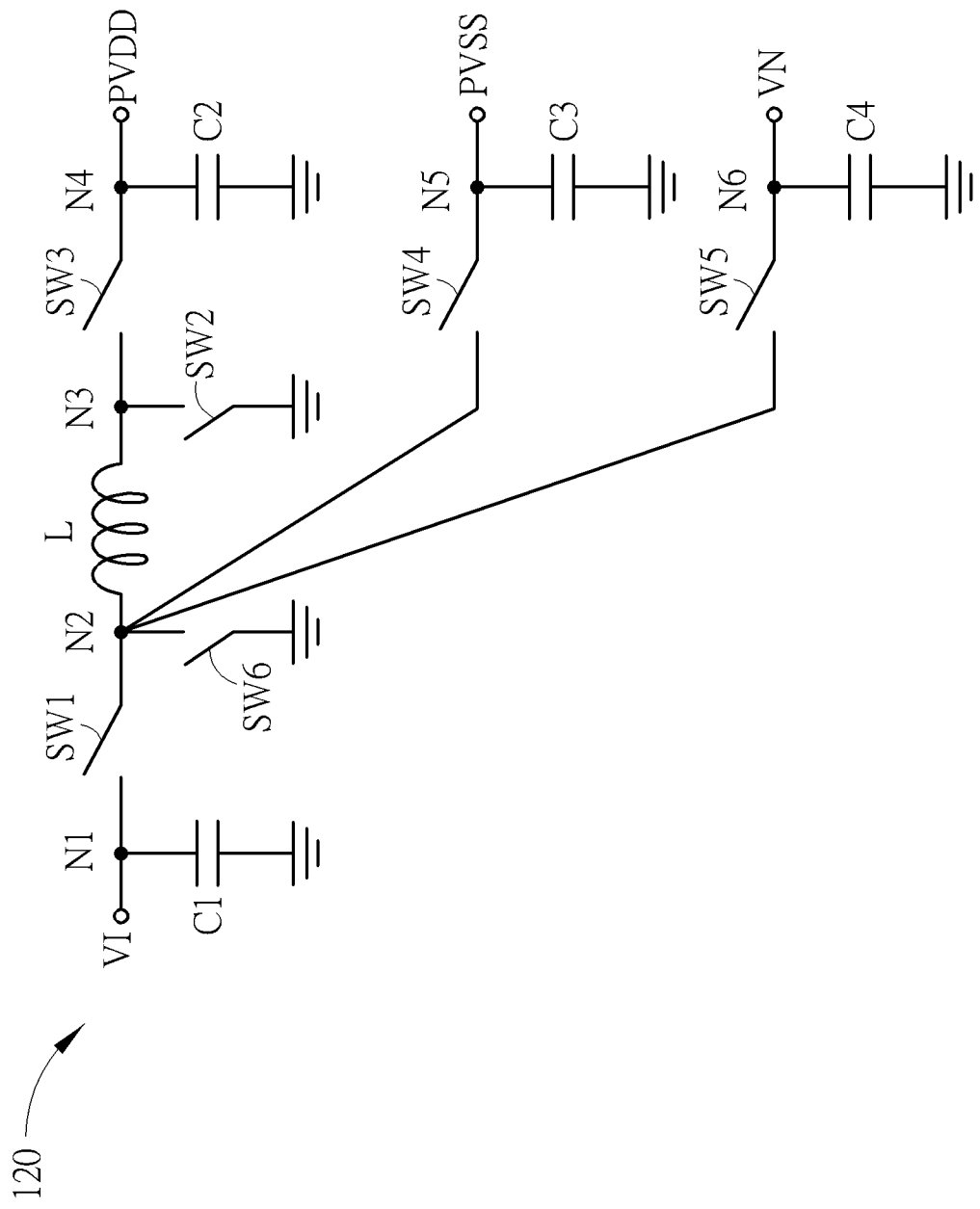
FIG. 3 is a diagram illustrating a power converter according to one embodiment of the present invention.

FIG. 3 is a diagram illustrating the power converter 120 according to one embodiment of the present invention. As shown in FIG. 3, the power converter 120 comprises an input capacitor C1, an inductor L, three output capacitors C2-C4 and a plurality of switches SW1-SW6. The input capacitor C1 is coupled between a node N1 and a ground voltage, the output capacitor C2 is coupled between a node N4 and the ground voltage, the output capacitor C3 is coupled between a node N5 and the ground voltage, and the output capacitor C4 is coupled between a node N6 and the ground voltage. The switch SW1 is coupled between the node N1 and a node N2, and the switch SW1 is configured to selectively connect an input voltage (i.e., the supply voltage VI) to a first terminal of the inductor L. The switch SW6 is coupled between the node N2 and the ground voltage, and the switch SW6 is configured to selectively connect the first terminal of the inductor L to the ground voltage. The switch SW3 is coupled between a node N3 and the node N4, and the switch SW3 is configured to selectively connect a second terminal of the inductor L to the node N4 to adjust a voltage level of the supply voltage PVDD. The switch SW2 is coupled between the node N3 and the ground voltage, and the switch SW2 is configured to selectively connect the second terminal of the inductor L to the ground voltage. The switch SW4 is coupled between the node N2 and the node N5, and the switch SW4 is configured to selectively connect the first terminal of the inductor L to the node N5 to adjust a voltage level of the supply voltage PVSS. The switch SW5 is coupled between the node N2 and the node N6, and the switch SW5 is configured to selectively connect the first terminal of the inductor L to the node N6 to stabilize a voltage level of the negative supply voltage VN.

In the power converter 120 shown in FIG. 1, because only one inductor L is used to generate the supply voltages PVDD, PVSS and the negative supply voltage VN, the form factor and manufacturing cost of the power converter 120 can be reduced. In addition, the controls of the switches SW1-SW6 are based on the audio signal, the voltage levels of the supply voltages PVDD, PVSS and the negative supply voltage VN, and by controlling the switches SW1-SW6 to control a current of the inductor L to generate the supply voltages PVDD, PVSS and the negative supply voltage VN with suitable voltage levels, the power converter 120 will have better efficiency. The details are described as follows.

Figure 4:
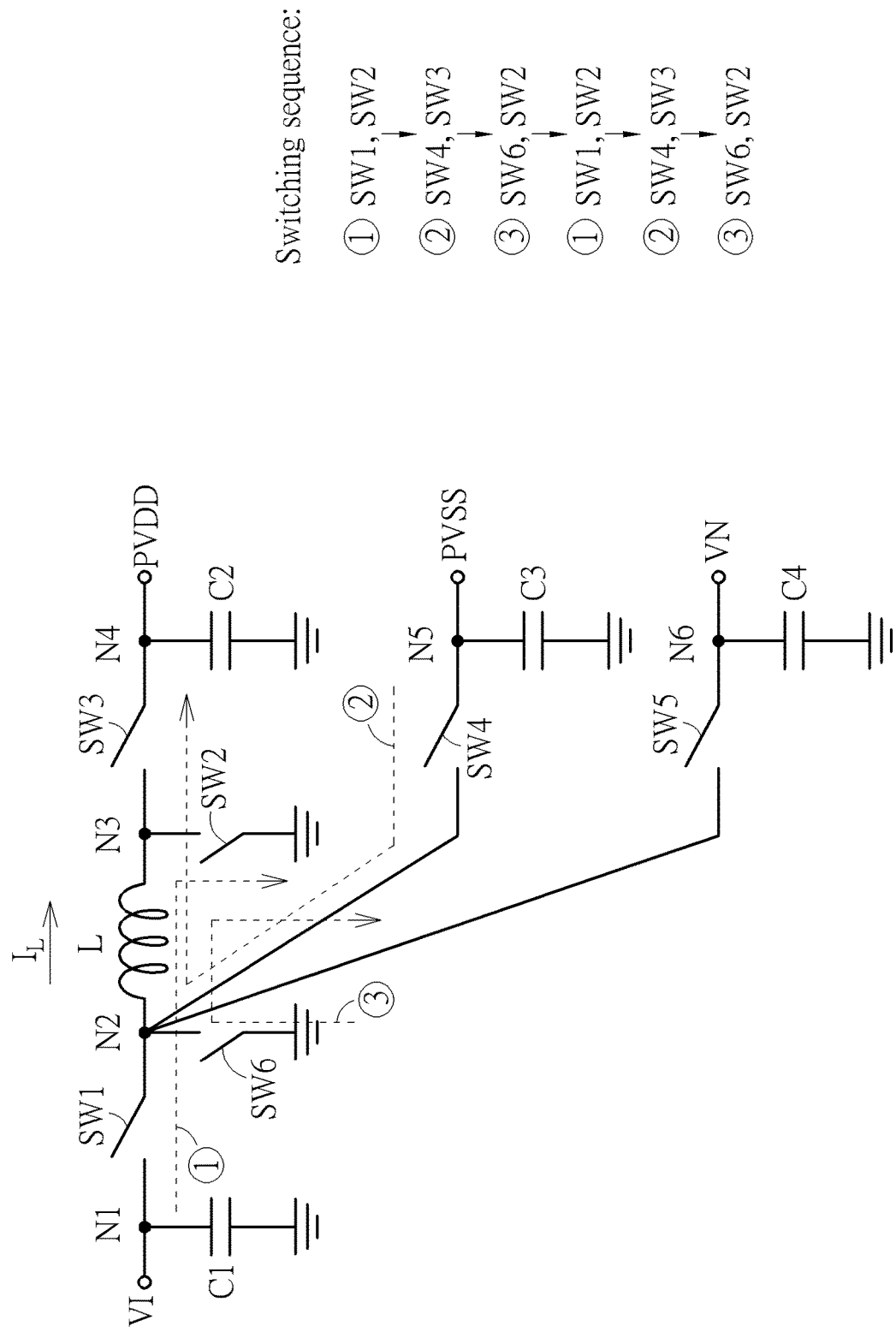
FIG. 4 shows a control method of the power converter according to one embodiment of the present invention.
Figure 5:
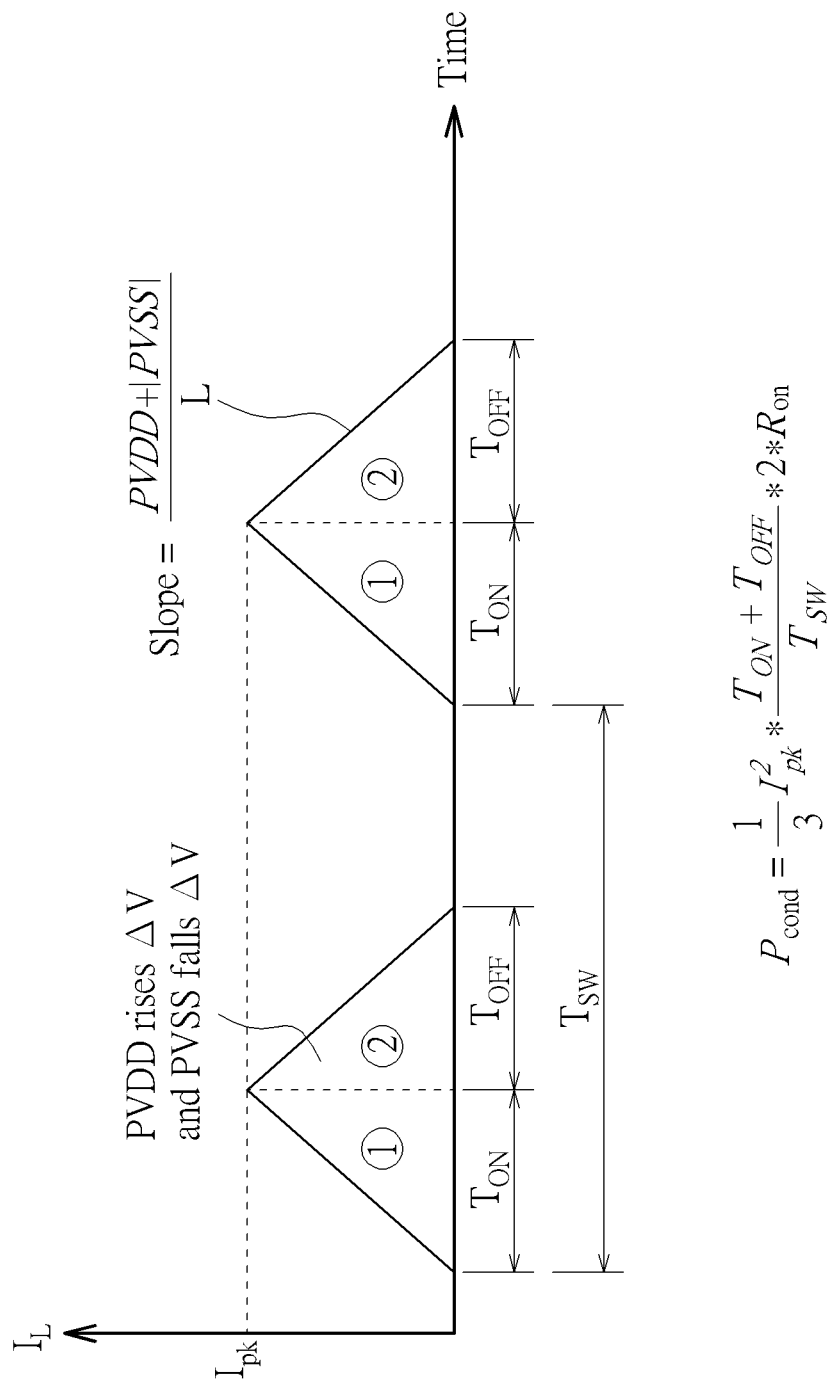
FIG. 5 shows the inductor current in the power converter according to one embodiment of the present invention.

When the load RL shown in FIG. 1 is a full-bridge load, there is a current path through the load RL between the supply voltages PVDD and PVSS, and the level of the supply voltage PVDD will drop while the level of the supply voltage PVSS will rise. To make the supply voltages PVDD and PVSS have the desired voltage levels with higher efficiency, FIG. 4 shows a control method of the switches SW1-SW6 according to one embodiment of the present invention. Referring to FIG. 4 and FIG. 5 together, in a first period, the switches SW1 and SW2 are enabled, and the switches SW3-SW6 are disabled. At this time, a current is flowing from the node N1, the switch SW1, the node N2, the inductor L, the node N3 and the switch SW2 to the ground voltage, and an inductor current $I_L$ is increasing. In a second period immediately following the first period, the switches SW4 and SW3 are enabled, and the switches SW1, SW2, SW5 and SW6 are disabled. At this time, a current is flowing from the node N5, the switch SW4, the node N2, the inductor L, the node N3, the switch SW3 to the node N4, and the inductor current $I_L$ is decreasing. In the second period, because the supply voltage PVDD is coupled to the supply voltage PVSS through the inductor L, the inductor current $I_L$ will decrease rapidly due to the large voltage difference between two terminals of the inductor L, for example, a slope of the inductor current drop is equal to $$\frac{PVDD + |PVSS|}{L}.$$

Referring to FIG. 5, in the first period and the second period, the conduction power loss of the switches can be represented in the following formula:

$$P_{cond} = \frac{1}{3}I_{pk}^2 * \frac{T_{ON} + T_{OFF}}{T_{SW}} * 2 * R_{on}; \qquad (1)$$

wherein "$P_{cond}$" is the conduction power loss, "$I_{pk}$" is a peak of the inductor current, "$T_{ON}$" refers to a time for the inductor current $I_L$ to rise, "$T_{OFF}$" refers to a time for the inductor current $I_L$ to drop, "$T_{SW}$" is the switching period, and "$R_{on}$" is an on-resistance of each switch (assuming that each switch has the same $R_{on}$). Because the embodiment has a larger slope of the inductor current drop, the parameter "$T_{OFF}$" in the formula (1) will have a smaller value, so that the switches in the power converter 120 have lower conduction power loss.

In addition, the supply voltage PVDD rises while the supply voltage PVSS falls within the second period, so the efficiency of the power converter 120 can be improved.

The power converter 120 switches from the second period to the third period when the inductor current $I_L$ drops to near zero. In a third period immediately following the second period, the switches SW6 and SW2 are enabled, and the switches S1, SW3-SW5 are disabled. At this time, two terminals of the inductor L are connected to the ground voltage to make sure that the inductor current $I_L$ become zero. After the third period, the switches SW1-SW6 can be controlled based on the audio signal, the voltage levels of the supply voltages PVDD, PVSS and the negative supply voltage VN. For example, the power converter 120 can perform the above operations corresponding to the first period to the third period again.

Figure 6:
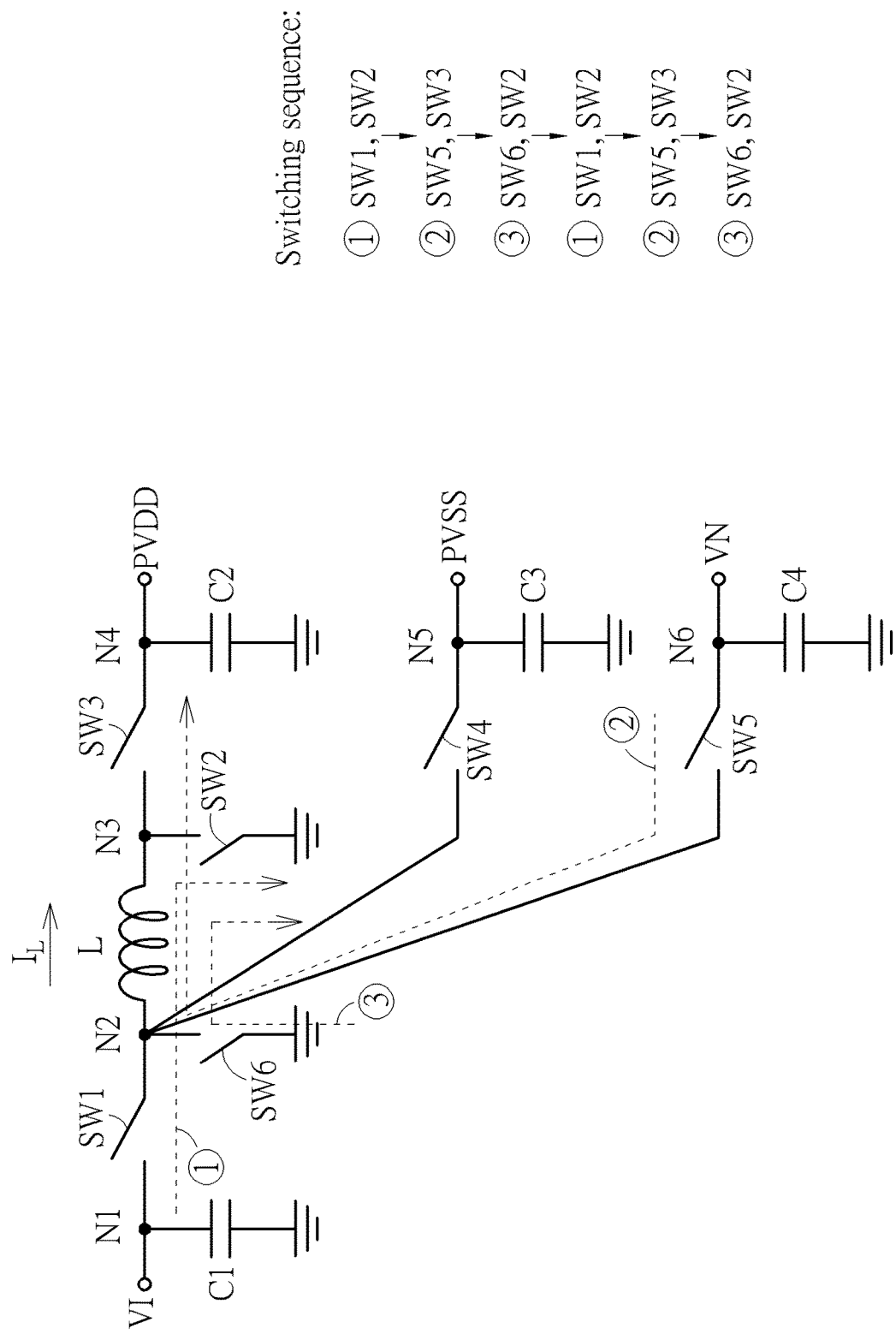
FIG. 6 shows a control method of the power converter according to one embodiment of the present invention.

In one embodiment, when the level of the supply voltage PVDD is lower than the desired level while the negative supply voltage VN is above its desired level, FIG. 6 shows a control method of the switches SW1-SW6 according to one embodiment of the present invention. Referring to FIG. 6, in a first period, the switches SW1 and SW2 are enabled, and the switches SW3-SW6 are disabled. At this time, a current is flowing from the node N1, the switch SW1, the node N2, the inductor L, the node N3 and the switch SW2 to the ground voltage, and an inductor current $I_L$ is increasing. In a second period immediately following the first period, the switches SW5 and SW3 are enabled, and the switches SW1, SW2, SW4 and SW6 are disabled. At this time, a current is flowing from the node N6, the switch SW5, the node N2, the inductor L, the node N3, the switch SW3 to the node N4, and the inductor current $I_L$ is decreasing. In the second period, because the supply voltage PVDD is coupled to the supply voltage PVSS through the inductor L, the inductor current $I_L$ will decrease rapidly due to the large voltage difference between two terminals of the inductor L. Referring to the above formula (1), because the embodiment has a larger slope of the inductor current drop, the parameter "$T_{OFF}$" in the formula (1) will have a smaller value, so that the switches in the power converter 120 have lower conduction power loss.

In a third period immediately following the second period, the switches SW6 and SW2 are enabled, and the switches S1, SW3-SW5 are disabled. At this time, two terminals of the inductor L are connected to the ground voltage to make sure that the inductor current $I_L$ become zero. After the third period, the switches SW1-SW6 can be controlled based on the audio signal, the voltage levels of the supply voltages PVDD, PVSS and the negative supply voltage VN. For example, the power converter 120 can perform the above operations corresponding to the first period to the third period again.

In the above embodiments shown in FIG. 4-FIG. 6, by connecting the supply voltage PVSS to the supply voltage PVDD or connecting the negative supply voltage VN to the supply voltage PVDD in the second period, the power converter 120 can have lower conduction power loss and higher efficiency. However, because the power converter 120 of this embodiment has more switching times, for example, the six periods shown in FIG. 4 or FIG. 6 have eleven switching times, the power converter 120 may have higher switching power loss. To solve this problem, each of the switches SW2 and SW6 can be designed to have a large part and a small part, and only the smaller parts of the switches SW2 and SW6 are enabled during the third period, to decrease the switching power loss. Specifically, referring to FIG. 7, the switch SW6 shown in FIG. 3 can be implemented by using a large switch SW6L and a small switch SW6S, wherein the large switch SW6L is coupled between the node N2 and the ground voltage, and the small switch SW6S is coupled between the node N2 and the ground voltage. In this embodiment, the large switch SW6L has a large size and larger current when it is enabled, and the small switch SW6S has a small size and smaller current when it is enabled. Similarly, the switch SW2 shown in FIG. 3 can be implemented by using a large switch SW2L and a small switch SW2S, wherein the large switch SW2L is coupled between the node N2 and the ground voltage, and the small switch SW2S is coupled between the node N2 and the ground voltage. In this embodiment, the large switch SW2L has a large size and larger current when it is enabled, and the small switch SW2S has a small size and smaller current when it is enabled.

Figure 7:
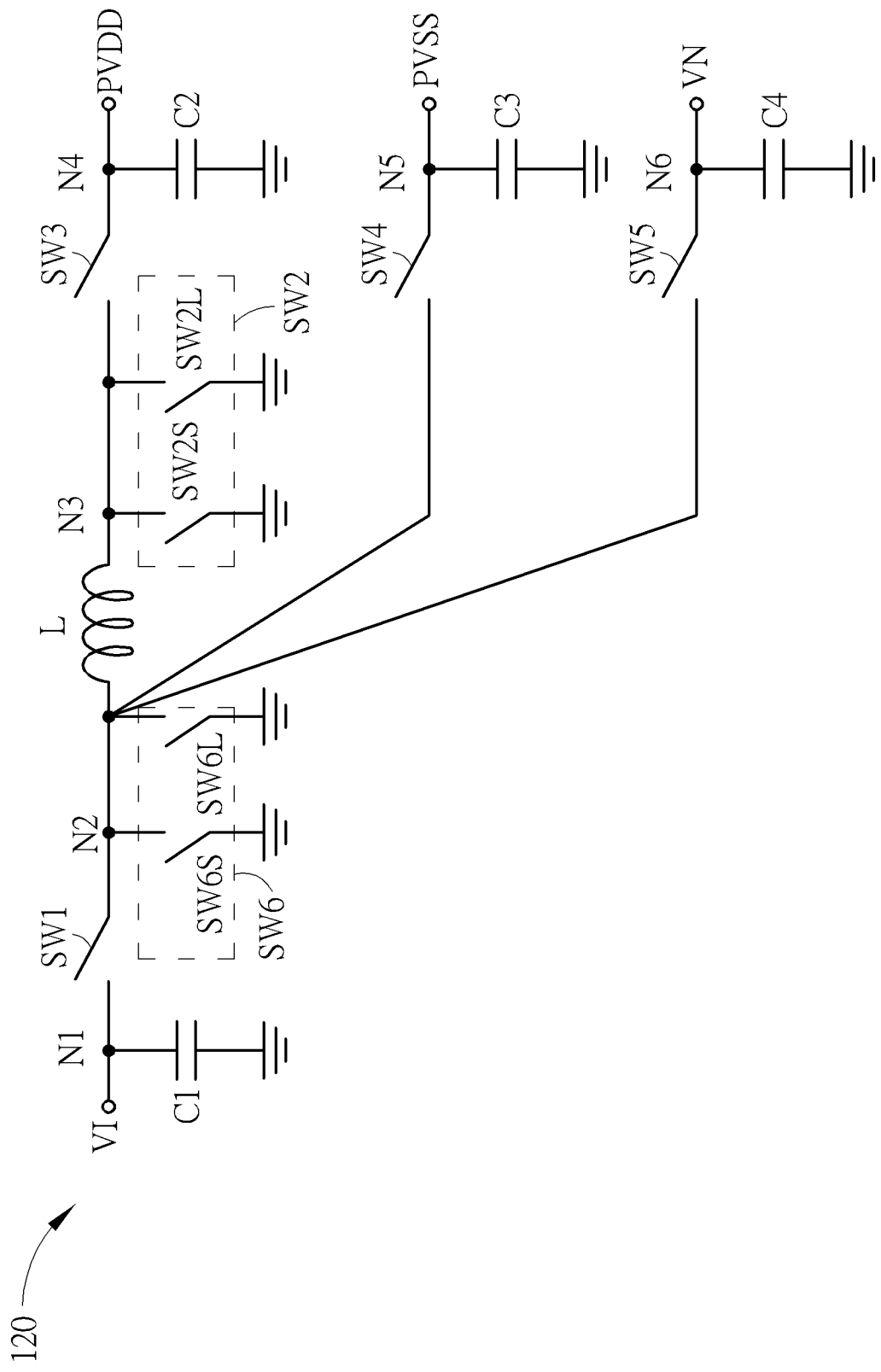
FIG. 7 is a diagram illustrating another power converter according to one embodiment of the present invention.

In the embodiment shown in FIG. 7, when the level of the supply voltage PVDD is lower than the desired level while the supply voltage PVSS is above its desired level, in a first period, the switches SW1 and SW2 are enabled (in the switch SW2, at least the large switch SW2L is enabled), and the switches SW3-SW6 are disabled. At this time, a current is flowing from the node N1, the switch SW1, the node N2, the inductor L, the node N3 and the large switch SW2 to the ground voltage, and an inductor current $I_L$ is increasing. In a second period immediately following the first period, the switches SW4 and SW3 are enabled, and the switches SW1, SW2, SW5 and SW6 are disabled. At this time, a current is flowing from the node N5, the switch SW4, the node N2, the inductor L, the node N3, the switch SW3 to the node N4, and the inductor current $I_L$ is decreasing. In a third period immediately following the second period, only the small switches SW6S and SW2S are enabled, and the switches S1, SW3-SW5, the large switch SW6L and SW2L are disabled. At this time, two terminals of the inductor L are connected to the ground voltage to make sure that the inductor current $I_L$ become zero. After the third period, the switches SW1-SW6 can be controlled based on the audio signal, the voltage levels of the supply voltages PVDD, PVSS and the negative supply voltage VN. For example, the power converter 120 can perform the above operations corresponding to the first period to the third period again.

In another embodiment shown in FIG. 7, when the level of the supply voltage PVDD is lower than the desired level while the negative supply voltage VN is above its desired level, in a first period, the switches SW1 and SW2 are enabled (in the switch SW2, at least the large switch SW2L is enabled), and the switches SW3-SW6 are disabled. At this time, a current is flowing from the node N1, the switch SW1, the node N2, the inductor L, the node N3 and the large switch SW2 to the ground voltage, and an inductor current $I_L$ is increasing. In a second period immediately following the first period, the switches SW5 and SW3 are enabled, and the switches SW1, SW2, SW4 and SW6 are disabled. At this time, a current is flowing from the node N6, the switch SW5, the node N2, the inductor L, the node N3, the switch SW3 to the node N4, and the inductor current $I_L$ is decreasing. In a third period immediately following the second period, only the small switches SW6S and SW2S are enabled, and the switches S1, SW3-SW5, the large switch SW6L and SW2L are disabled. At this time, two terminals of the inductor L are connected to the ground voltage to make sure that the inductor current $I_L$ become zero. After the third period, the switches SW1-SW6 can be controlled based on the audio signal, the voltage levels of the supply voltages PVDD, PVSS and the negative supply voltage VN. For example, the power converter 120 can perform the above operations corresponding to the first period to the third period again.

In the above two embodiments, because the inductor current $I_L$ is very small in the inductor-current freewheeling period (i.e., the above third period), the small switches SW6S and SW2S are enough for the operation. In addition, because the small switches SW6S and SW2S have low switching power loss, by only enabling the small switches SW6S and SW2S in the third period, the overall switching power loss can be effectively reduced.

In the above embodiments, the power converter 120 is configured to receive the input voltage VI to generate three supply voltages PVDD, PVSS and VN. In another embodiment, the switch SW6, the node N6 and the output capacitor C4 can be removed from the power converter 120, that is the power converter 120 is configured to receive the input voltage VI to generate two supply voltages PVDD and PVSS. This alternative design shall fall within the scope of the present invention.

Briefly summarized, in the power converter of the amplifier system of the present invention, only one inductor is used to generate two or three supply voltages, so the power converter can have a lower manufacturing cost. In addition, by using a specific switch control method proposed in the embodiments of the present invention, the power converter has higher efficiency, lower conduction power loss and lower switching power loss.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. An amplifier system, comprising:
an audio amplifier supplied by at least a first supply voltage and a second supply voltage, configured to receive an audio signal to generate an output signal; and
a power converter comprising only one inductor, configured to generate the first supply voltage and the second supply voltage according to an input voltage;
wherein the power converter comprises:
an inductor, wherein a first terminal of the inductor is selectively coupled to the input voltage or the first supply voltage, and a second terminal of the inductor is selectively coupled to the second supply voltage;

wherein in a first period, the input voltage is inputted to the inductor and an inductor current is increasing; in a second period following the first period, the input voltage is disconnected from the inductor, and the second supply voltage is coupled to the first supply voltage through the inductor, and the inductor current is decreasing; and in a third period following the second period, the input voltage, the first supply voltage and the second supply voltage are disconnected from the inductor.

2. The amplifier system of claim 1, wherein the first supply voltage and the second supply voltage are signal-dependent supply voltages whose voltage levels are determined according to the audio signal.

3. An amplifier system, comprising:
an audio amplifier supplied by at least a first supply voltage and a second supply voltage, configured to receive an audio signal to generate an output signal; and
a power converter comprising only one inductor, configured to generate the first supply voltage and the second supply voltage according to an input voltage;
wherein the power converter comprises:
an inductor, wherein a first terminal of the inductor is selectively coupled to the input voltage or the first supply voltage, and a second terminal of the inductor is selectively coupled to the second supply voltage;
a first switch, configured to selectively connect the input voltage to the first terminal of the inductor;
a second switch, configured to selectively connect the second terminal of the inductor to a ground voltage;
a third switch, configured to selectively connect the second terminal of the inductor to the first supply voltage;
a fourth switch, configured to selectively connect the first terminal of the inductor to the second supply voltage; and
a fifth switch, configured to selectively connect the first terminal of the inductor to the ground voltage.

4. The amplifier system of claim 3, wherein in a first period, the first switch and the second switch are enabled, the third switch, the fourth switch and the fifth switch are disabled, and the input voltage is inputted to the inductor and an inductor current is increasing; in a second period following the first period, the third switch and the fourth switch are enabled, the first switch, the second switch and the fifth switch are disabled, and the second supply voltage is coupled to the first supply voltage through the inductor, and the inductor current is decreasing; and in a third period following the second period, the second switch and the fifth switch are enabled, and the first switch, the third switch and the fourth switch are disabled.

5. The amplifier system of claim 4, wherein the second switch comprises a large switch and a small switch, wherein the large switch is configured to selectively connect the second terminal of the inductor to the ground voltage, the small switch is configured to selectively connect the second terminal of the inductor to the ground voltage, and a current of the large switch is greater than a current of the small switch; and in the third period following the second period, only the small switch is enabled, and the large switch is disabled.

6. The amplifier system of claim 4, wherein the fifth switch comprises a large switch and a small switch, wherein the large switch is configured to selectively connect the second terminal of the inductor to the ground voltage, the small switch is configured to selectively connect the second terminal of the inductor to the ground voltage, and a current of the large switch is greater than a current of the small switch; and in the third period following the second period, only the small switch is enabled, and the large switch is disabled.

7. An amplifier system, comprising:
an audio amplifier supplied by at least a first supply voltage and a second supply voltage, configured to receive an audio signal to generate an output signal; and
a power converter comprising only one inductor, configured to generate the first supply voltage and the second supply voltage according to an input voltage;
wherein the audio amplifier is supplied by the first supply voltage, the second supply voltage and a negative supply voltage, and the power converter is configured to generate the first supply voltage, the second supply voltage and the negative supply voltage according to the input voltage and a ground voltage, wherein the first supply voltage and the second supply voltage are signal-dependent supply voltages whose voltage levels are determined according to the audio signal, the negative supply voltage is different from the ground voltage, and the negative supply voltage has a fixed voltage level.

8. The amplifier system of claim 7, wherein the power converter comprises:
an inductor having a first terminal and second terminal;
a first switch, configured to selectively connect the input voltage to the first terminal of the inductor;
a second switch, configured to selectively connect the second terminal of the inductor to the ground voltage;
a third switch, configured to selectively connect the second terminal of the inductor to the first supply voltage;
a fourth switch, configured to selectively connect the first terminal of the inductor to the second supply voltage;
a fifth switch, configured to selectively connect the first terminal of the inductor to the negative supply voltage; and
a sixth switch, configured to selectively connect the first terminal of the inductor to the ground voltage.

9. The amplifier system of claim 8, wherein in a first period, the first switch and the second switch are enabled, the third switch, the fourth switch, the fifth switch and the sixth switch are disabled, and the input voltage is inputted to the inductor and an inductor current is increasing; in a second period following the first period, the third switch and the fourth switch are enabled, the first switch, the second switch, the fifth switch and the sixth switch are disabled, and the second supply voltage is coupled to the first supply voltage through the inductor, and the inductor current is decreasing; and in a third period following the second period, the second switch and the sixth switch are enabled, and the first switch, the third switch, the fourth switch and the fifth switch are disabled.

10. The amplifier system of claim 8, wherein in a first period, the first switch and the second switch are enabled, the third switch, the fourth switch, the fifth switch and the sixth switch are disabled, and the input voltage is inputted to the inductor and an inductor current is increasing; in a second period following the first period, the third switch and the fifth switch are enabled, the first switch, the second switch, the fourth switch and the sixth switch are disabled, and the second supply voltage is coupled to the first supply voltage through the inductor, and the inductor current is decreasing; and in a third period following the second period, the second switch and the sixth switch are enabled, and the first switch, the third switch, the fourth switch and the fifth switch are disabled.

11. A power converter configured to receive an input voltage to generate a first supply voltage, a second supply voltage, and a third supply voltage, comprising:
an inductor having a first terminal and a second terminal;
a first switch, configured to selectively connect the input voltage to the first terminal of the inductor;
a second switch, configured to selectively connect the second terminal of the inductor to a ground voltage;
a third switch, configured to selectively connect the second terminal of the inductor to the first supply voltage;
a fourth switch, configured to selectively connect the first terminal of the inductor to the second supply voltage;
a fifth switch, configured to selectively connect the first terminal of the inductor to the third voltage; and
a sixth switch, configured to selectively connect the first terminal of the inductor to the ground voltage.

12. The power converter of claim 11, wherein in a first period, the first switch and the second switch are enabled, the third switch, the fourth switch, the fifth switch and the sixth switch are disabled, and the input voltage is inputted to the inductor and an inductor current is increasing; in a second period following the first period, the third switch and the fourth switch are enabled, the first switch, the second switch, the fifth switch and the sixth switch are disabled, and the second supply voltage is coupled to the first supply voltage through the inductor, and the inductor current is decreasing; and in a third period following the second period, the second switch and the sixth switch are enabled, and the first switch, the third switch, the fourth switch and the fifth switch are disabled.

13. The power converter of claim 12, wherein the sixth switch comprises a large switch and a small switch, wherein the large switch is configured to selectively connect the second terminal of the inductor to the ground voltage, the small switch is configured to selectively connect the second terminal of the inductor to the ground voltage, and a current of the large switch is greater than a current of the small switch; and in the third period following the second period, only the small switch is enabled, and the large switch is disabled.

14. The power converter of claim 12, the second switch comprises a large switch and a small switch, wherein the large switch is configured to selectively connect the second terminal of the inductor to the ground voltage, the small switch is configured to selectively connect the second terminal of the inductor to the ground voltage, and a current of the large switch is greater than a current of the small switch; and in the third period following the second period, only the small switch is enabled, and the large switch is disabled.

15. The power converter of claim 12, wherein the audio amplifier is supplied by the first supply voltage, the second supply voltage and a negative supply voltage, and the power converter is configured to generate the first supply voltage, the second supply voltage and the negative supply voltage according to the input voltage, wherein the first supply voltage and the second supply voltage are signal-dependent supply voltages whose voltage levels are determined according to the audio signal, and the negative supply voltage has a fixed voltage level.

* * * * *